United States Patent
Huang et al.

(10) Patent No.: US 9,870,443 B2
(45) Date of Patent: Jan. 16, 2018

(54) METHOD AND APPARATUS FOR INTEGRATED CIRCUIT MASK PATTERNING

(71) Applicant: Taiwan Semiconductor Manufacturing Company, Ltd., Hsin-Chu (TW)

(72) Inventors: Chin-Min Huang, Taichung (TW); Bo-Han Chen, Hsinchu (TW); Cherng-Shyan Tsay, Toufen Township (TW); Chien Wen Lai, Hsinchu (TW); Hua-Tai Lin, Hsinchu (TW); Chia-Cheng Chang, Baoshan Township (TW); Lun-Wen Yeh, Ji-an Township (TW); Shun-Shing Yang, Tainan (TW)

(73) Assignee: TAIWAN SEMICONDUCTOR MANUFACTURING COMPANY, LTD., Hsin-chu (TW)

( * ) Notice: Subject to any disclaimer, the term of this patent is extended or adjusted under 35 U.S.C. 154(b) by 154 days.

(21) Appl. No.: 14/949,713

(22) Filed: Nov. 23, 2015

(65) Prior Publication Data

US 2016/0085906 A1  Mar. 24, 2016

Related U.S. Application Data

(62) Division of application No. 13/956,962, filed on Aug. 1, 2013, now Pat. No. 9,195,134.

(51) Int. Cl.
*G06F 17/50* (2006.01)
*G03F 1/36* (2012.01)
*G03F 1/70* (2012.01)

(52) U.S. Cl.
CPC ............ *G06F 17/5081* (2013.01); *G03F 1/36* (2013.01); *G03F 1/70* (2013.01)

(58) Field of Classification Search
CPC .................................. G03F 1/144; G03F 1/36
USPC .......................................................... 716/53
See application file for complete search history.

(56) References Cited

U.S. PATENT DOCUMENTS

| | | | |
|---|---|---|---|
| 5,821,014 A | 10/1998 | Chen et al. | |
| 6,370,679 B1 * | 4/2002 | Chang ....................... | G03F 1/36 430/30 |
| 7,487,489 B2 * | 2/2009 | Granik ....................... | G03F 1/36 716/51 |
| 7,849,423 B1 * | 12/2010 | Yenikaya .................. | G03F 1/36 716/55 |
| 8,972,909 B1 * | 3/2015 | Chang ....................... | G03F 1/36 378/35 |
| 2007/0128526 A1 | 6/2007 | Wallace et al. | |
| 2007/0224519 A1 | 9/2007 | Sivakumar et al. | |
| 2008/0063948 A1 | 3/2008 | O'Brien | |
| 2008/0082952 A1 | 4/2008 | O'Brien | |
| 2008/0301620 A1 | 12/2008 | Ye et al. | |
| 2009/0138835 A1 | 5/2009 | Sinha et al. | |

(Continued)

*Primary Examiner* — Suresh Memula
(74) *Attorney, Agent, or Firm* — Haynes and Boone, LLP

(57) ABSTRACT

Provided is an integrated circuit (IC) design method. The method includes receiving a design layout of the IC, the design layout having a first main feature, and adding a negative assist feature to the design layout, wherein the negative assist feature has a first width, the negative assist feature divides the first main feature into a second main feature and a third main feature by the first width, and the first width is sub-resolution in a photolithography process.

20 Claims, 6 Drawing Sheets

(56) References Cited

U.S. PATENT DOCUMENTS

| | | | |
|---|---|---|---|
| 2010/0023915 A1* | 1/2010 | Granik | G03F 1/36 |
| | | | 716/50 |
| 2010/0138806 A1 | 6/2010 | Tang | |
| 2010/0262946 A1* | 10/2010 | Poonawala | G06F 17/5081 |
| | | | 716/50 |
| 2012/0072874 A1 | 3/2012 | Chiang et al. | |
| 2012/0083124 A1 | 4/2012 | Huang et al. | |
| 2014/0317581 A1* | 10/2014 | Chuang | H01L 21/0274 |
| | | | 716/53 |

\* cited by examiner

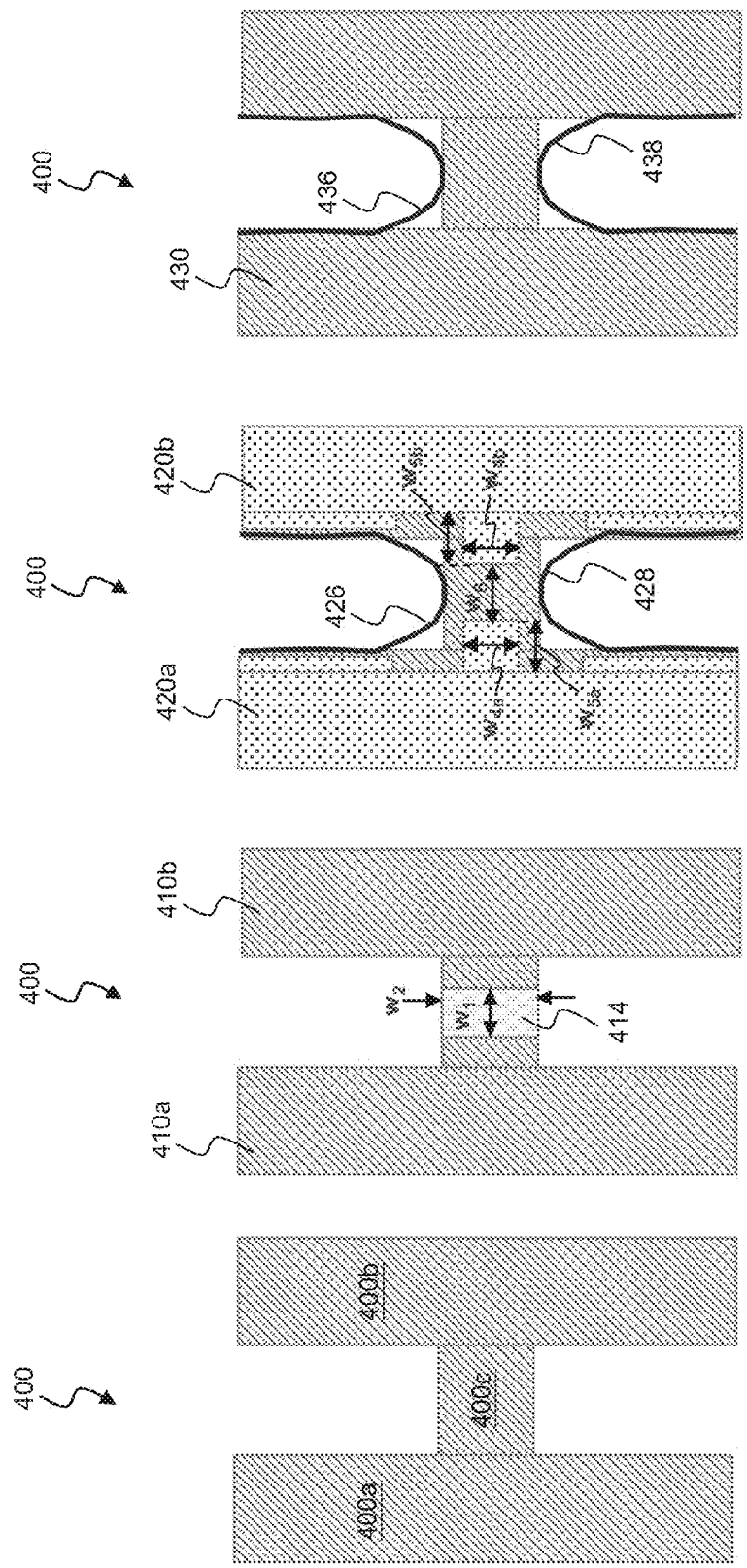

METHOD AND APPARATUS FOR INTEGRATED CIRCUIT MASK PATTERNING

CROSS-REFERENCE TO RELATED APPLICATIONS

This application is a divisional application of U.S. Ser. No. 13/956,962, filed Aug. 1, 2013 by inventors Chin-Min Huang, et al., entitled "Method and Apparatus for Integrated Circuit Mask Patterning", the disclosure of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as IC technologies are continually progressing to smaller technology nodes, such as a 65 nm technology node, a 45 nm technology node, and below, simply scaling down similar designs used at larger nodes often results in inaccurate or poorly shaped device features. Rounded corners on a device feature that is designed to have right-angle corners may become more pronounced or more critical in the smaller nodes, preventing the device from performing as desired. Other examples of inaccurate or poorly shaped device features include pinching, necking, bridging, dishing, erosion, metal line thickness variations, and other characteristics that affect device performance. Typically, optical proximity correction (OPC) may be performed on a design pattern to help alleviate some of these difficulties before the pattern is created on a mask. However, current OPC techniques may not offer enough fidelity to correct problems in sub-45 nm designs. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A-4D illustrate an IC feature mask creation according to various aspects of the present disclosure.

DETAILED DESCRIPTION

Figure 1:
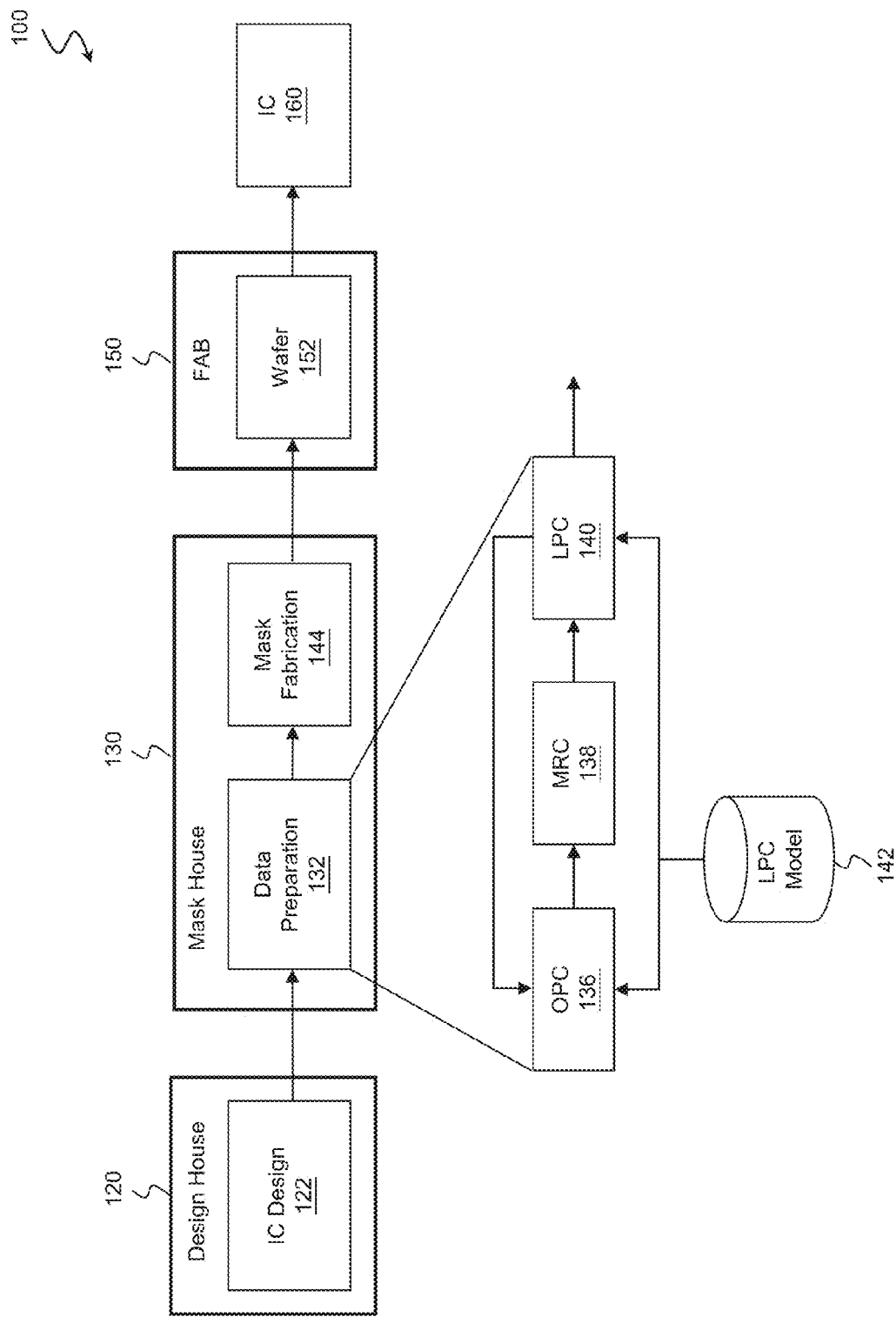
FIG. 1 is a simplified block diagram of an embodiment of an integrated circuit (IC) manufacturing system and an associated IC manufacturing flow.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single larger company, and may even coexist in a common facility and use common resources.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format or DFII file format.

The mask house 130 uses the IC design layout 122 to manufacture one or more masks to be used for fabricating the various layers of the IC device 160 according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) 136, a mask rule checker (MRC) 138 and a lithography process checker (LPC) 140. OPC 136 uses lithography enhancement techniques to compensate for image errors, such as those that can arise from diffraction, interference, or other process effects. OPC 136 may add assist features, such as scattering bars, serif, and/or hammerheads to the IC design layout 122 according to optical models or rules such that, after a lithography process, a final pattern on a wafer is improved with enhanced resolution and precision. Optical proximity correction according to the illustrated embodiment will be described in greater detail below. The mask data preparation 132 can include further resolution enhancement techniques, such as off-axis illumination, sub-resolution assist features, phase-shifting masks, other suitable techniques, or combinations thereof.

MRC 138 checks the IC design layout that has undergone processes in OPC 136 with a set of mask creation rules which may contain certain geometric and connectivity restrictions to ensure sufficient margins, to account for variability in semiconductor manufacturing processes. MRC 138 modifies the IC design layout to compensate for limitations during mask fabrication 144. In some scenarios, MRC 138 may undo part of the modifications performed by OPC 136 in order to meet mask creation rules. Consequently, resultant IC masks may not produce desirable IC features on a wafer. Enhancements in OPC 136 and MRC 138 processes according to various aspects of the present disclosure will be described in greater details below.

LPC 140 simulates processing that will be implemented by the IC manufacturer 150 to fabricate the IC device 160. LPC 140 simulates this processing based on the IC design layout 122 to create a simulated manufactured device, such as the IC device 160. In one embodiment, LPC 140 determines what shape a hypothetical photomask having a feature thus modified by OPC 136 and MRC 138 would produce on a wafer if the photomask was exposed by a photolithography tool described by the LPC models (or rules) 142. A simulated shape is called a contour. The simulated manufactured device includes simulated contours of all or a portion of the IC design layout. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated manufactured device has been created by LPC 140, if the simulated device is not close enough in shape to satisfy design rules, certain steps in the mask data preparation 132, such as OPC 136 and MRC 138, may be repeated to refine the IC design layout 122 further.

It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150. Additionally, the processes applied to the IC design layout 122 during data preparation 132 may be executed in a variety of different orders.

After mask data preparation 132 and during mask fabrication 144, a mask or a group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

The IC manufacturer 150, such as a semiconductor foundry, uses the mask (or masks) fabricated by the mask house 130 to fabricate the IC device 160. The IC manufacturer 150 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 160. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

Figure 2:
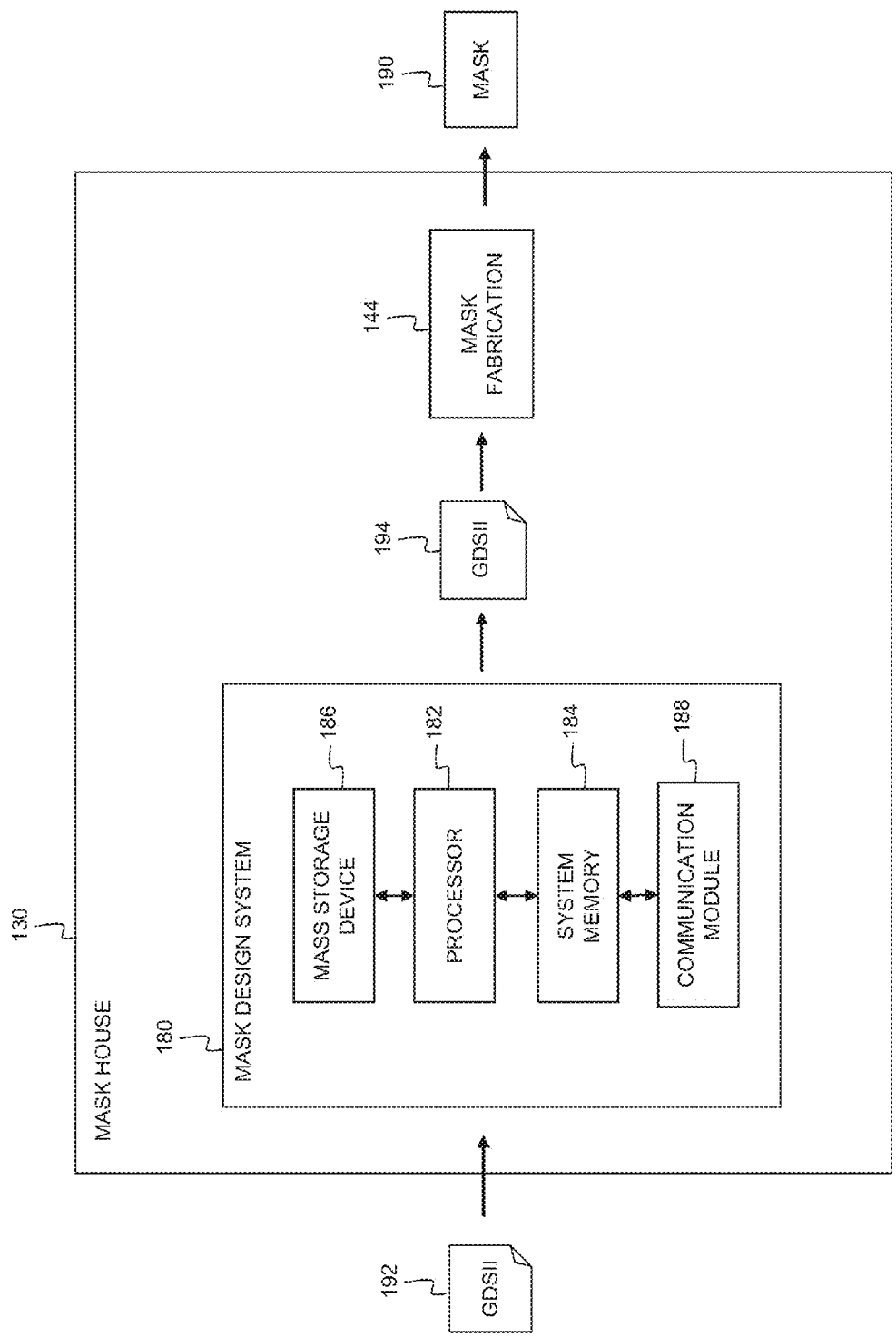
FIG. 2 is a more detailed block diagram of the mask house shown in FIG. 1 according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices known in the art. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices known in the art.

In operation, the mask design system 180 is configured to manipulate the IC design layout 122 according to a variety of design rules and limitations before it is transferred to a mask 190 by mask fabrication 144. For example, in one embodiment, OPC 136, MRC 138 and LPC 140 may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

Figure 3:
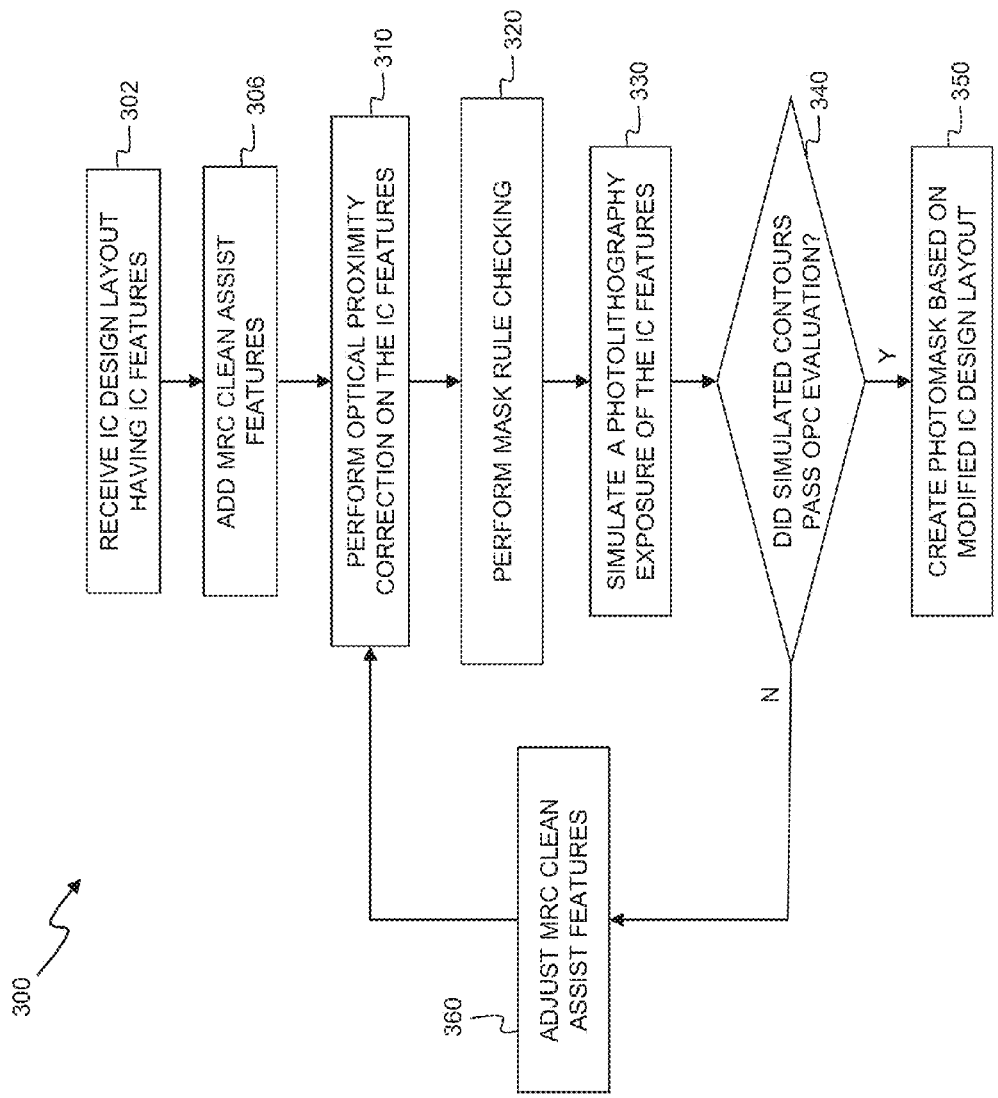
FIG. 3 is a high-level flowchart of a method of modifying an IC design layout before mask fabrication according to various aspects of the present disclosure.

FIG. 3 is a high-level flowchart of a method 300 of modifying an IC design layout before mask fabrication according to various aspects of the present disclosure. In one embodiment, the method 300 may be implemented in the mask data preparation 132 of mask house 130 shown in FIG. 1. Further, the method 300 in FIG. 3 is a high-level overview and details associated with each operation in the method will be described in association with the subsequent figures in the present disclosure.

The method 300 begins at operation 302 where the mask house 130 receives the IC design layout 122. The IC design layout 122 includes various geometrical patterns representing features of an integrated circuit. For example, the IC design layout 122 may include main IC features such as active regions, gate electrodes, sources and drains, metal lines, interlayer interconnection vias, and openings for bonding pads that may be formed in a semiconductor substrate (such as a silicon wafer) and various material layers disposed over the semiconductor substrate. The IC design layout 122 may also include certain assist features, such as those features for imaging effect, processing enhancement, and/or mask identification information.

In this regard, FIG. 4A illustrates an example IC feature 400 that is a feature contained in the IC design layout 122. The IC feature 400 may also be viewed as a sub-feature 400a connected with a sub-feature 400b by a sub IC feature 400c. Ideally, when the IC feature 400 is formed on the integrated circuit 160, it will maintain the same shape, but this is not always so due to limitations in various manufacturing processes.

The method 300 (FIG. 3) proceeds to operation 306 where an assist feature 414, having a width W1 and a length W2, is added to the IC feature 400. Further reference is made to FIG. 4B. The assist feature 414 meets mask creation rules. It is thus referred to as an MRC clean assist feature. In the present embodiment, the assist feature 414 has an effect of blocking a part of the IC feature 400 from being formed on the mask 190. Moreover, the assist feature 414 itself will not be formed on the mask 190. Such assist feature is referred to as a negative assist feature. In the present embodiment, the assist feature 414 is thus referred to as an MRC clean negative assist feature. As a result of adding the assist feature 414, the IC feature 400 is divided into two features, 410a and 410b, as illustrated in FIG. 4B, for remaining operations in the method 300. From an alternative point of view, the effect of adding the assist feature 414 is to remove part of the IC feature 400c thus disconnecting the IC feature 400a from the IC feature 400b. In other embodiments of present disclosure, an MRC clean assist feature is added to a design layout such that multiple IC features are thus connected by the MRC clean assist feature to form one IC feature for remaining operations in the method 300. Such MRC clean assist feature is thus referred to as an MRC clean positive assist feature. An MRC clean positive assist feature itself is also formed on the mask 190 as a sub-resolution feature. In another word, it does not become part of an IC device on a wafer.

The method 300 next proceeds to operation 310 where an optical proximity correction, such as OPC 136, is performed on the IC design layout 122 as modified in operation 306. In general, OPC is utilized to modify the shape of an IC feature to compensate for diffraction or other process effects so that the shape of the feature as formed in the final integrated circuit closely matches the shape of the feature in the IC design layout.

Referring now to FIG. 4C, in the present embodiment, OPC 136 is performed on the features 410a and 410b to generate two modified features 420a and 420b respectively. In one embodiment, OPC 136 includes an iterative process where at least part of an IC feature boundary is modified and thereafter a simulation is performed to generate contours.

Such process repeats until the simulated contours meet a target boundary. In the present embodiment as illustrated in FIG. 4C, parts of boundaries of the features 410a and 410b are modified such that contours 426 and 428 meet a target boundary as defined by an outer boundary of the IC feature 400, and the features 410a and 410b thus modified have become the features 420a and 420b respectively.

The method 300 next proceeds to operation 320 where the IC design layout as modified by operation 310 is checked against various mask creation rules. In the present embodiment, various dimensions of the features 420a and 420b are checked, including dimensions W4a, W5a, W4b and W5b, as shown in FIG. 4C. In the present embodiment, various spacing between the features 420a and 420b are also checked, including spacing W6 as shown in FIG. 4C. The various dimensions and spacing may be adjusted to meet mask creation rules. One rule on the spacing W6 is that it is a sub-resolution spacing during IC fabrication. In another word, when an IC is fabricated with a mask having the features 420a and 420b, the IC will contain one IC feature 430, as shown in FIG. 4D, and will not contain spacing W6.

The method 300 proceeds to operation 330 where a photolithography simulation, such as LPC 140 is performed on the design layout to generate simulated contours. In that regard, FIG. 4D illustrates example contours 436 and 438 that result from the photolithography simulation performed in operation 330 upon features 420a and 420b.

Next, the method 300 proceeds to operation 340 where simulated contours are compared to a target boundary along the IC feature 400. This operation is sometimes called an OPC evaluation. Specifically, it is determined whether the simulated contours meet or overlap the target boundary. If the simulated contours pass the OPC evaluation, then the method 300 finishes at operation 350 where the IC design layout having the features 420a and 420b is saved to the GDSII file 194 and transferred to mask fabrication 144, where the IC design layout is formed on the photomask 190. If the simulated contours do not pass the OPC evaluation, the method 300 proceeds instead to operation 360, where locations of the MRC clean assist features as well as various dimensions of MRC clean assist features are adjusted. Referring to FIG. 4B, in the present embodiment, dimensions W1 and W2 of the assist feature 414 may be adjusted while maintaining the assist feature 414 being MRC clean. Also in the present embodiment, the assist feature 414 may be moved within the sub-feature 400c while it still divides the IC feature 400 to two features. Thereafter, OPC steps described above are begun again to enhance the fidelity of the contours.

It is understood that the method of modifying an IC design layout before mask fabrication of the illustrated embodiment is simply an example and in alternative embodiments, additional and/or different steps may be included in the method. Further, the IC feature illustrated herein may be substituted for any number of different IC features, and the operations of method 300 may be applied to the different IC features in a similar manner. In one embodiment, after receiving an IC design layout in operation 302, an initial lithography process simulation of the IC design layout is performed to identify candidate IC features for operation 306. For example, a candidate IC feature is one having simulated contours off a target boundary as defined by an outer boundary of the IC feature.

Figure 5C:
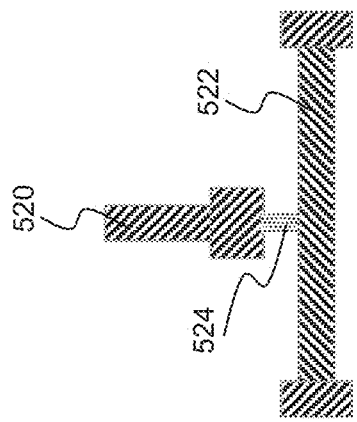
FIGS. 5A-5C illustrate another IC feature mask creation according to various aspects of the present disclosure.
Figure 5B:
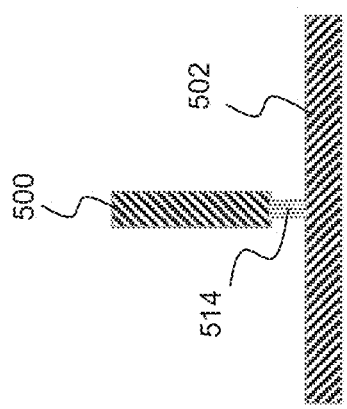
Figure 5A:
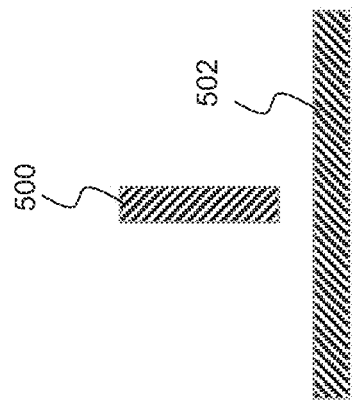
Figure 6C:
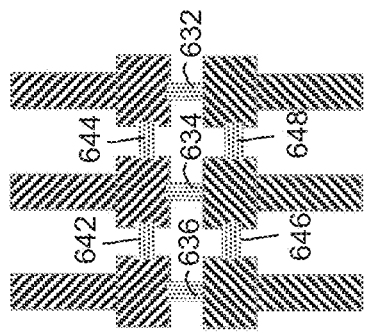
FIGS. 6A-6C illustrate various IC feature mask creation according to various aspects of the present disclosure.

Further, as illustrated above in FIGS. 4A-4D, the MRC clean negative assist feature 414 added in operation 306 has an effect of separating the IC feature 400 to multiple features with sub-resolution spacing for OPC 136 purposes. It thus increases the number of polygons in a design layout. In another embodiment, an MRC clean positive assist feature added in operation 306 may have an effect of connecting multiple IC features into one IC feature for OPC 136 purposes, thus reducing the number of polygons in a design layout. One example of using such an MRC clean positive assist feature is illustrated in FIGS. 5A-5C. FIG. 5A shows an IC design layout having two IC features, 500 and 502. The two IC features 500 and 502 are so spaced that an OPC is to be performed to the two IC features. FIG. 5B shows that an MRC clean positive assist feature 514 is added to the design layout, connecting the IC features 500 and 502. FIG. 6C shows that, OPC 136 modifies outer boundaries of IC features 500 and 502 for correcting optical proximity effect, resulting in modified IC features 520 and 522 respectively. Also shown in FIG. 5C is a sub-resolution feature 524, resulted from the MRC clean positive assist feature 514.

Figure 6B:
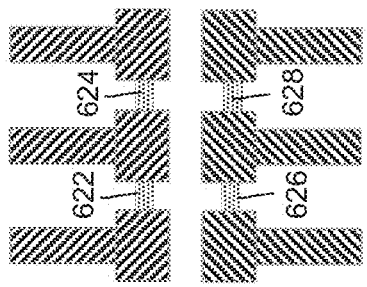
Figure 6A:
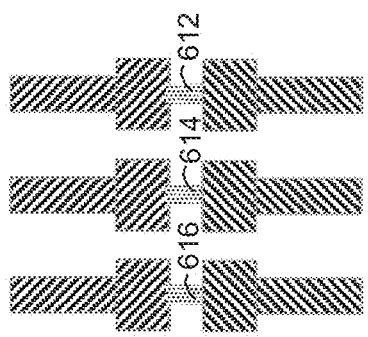

More examples of using MRC clean positive assist features for OPC purposes are illustrated in FIGS. 6A-6C. FIG. 6A shows MRC clean positive assist features, 612, 614 and 616, connecting main IC features head-to-head. FIG. 6B shows MRC clean positive assist features 622, 624, 626 and 628, connecting main IC features side-by-side. FIG. 6C shows MRC clean positive assist features, 632, 634, 636, 642, 644, 646 and 648, connecting main IC features head-to-head and side-by-side.

Further, the method 300 of modifying an IC design layout before mask fabrication of the illustrated embodiment is designed to be executed on any computing architecture, such as the mask design system 180 described in association with FIG. 2. For example, the method 300 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware subsystems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to an integrated circuit (IC) design method. The method includes receiving a design layout of the IC, the design layout having a first main feature, and adding a negative assist feature to the design layout, wherein the negative assist feature has a first width, the negative assist feature divides the first main feature into a second main feature and a third main feature by the first width, and the first width is sub-resolution in a photolithography process.

In another exemplary aspect, the present disclosure is directed to an integrated circuit (IC) design method. The method includes receiving a design layout of the IC, the design layout having a first and a second main features, and adding an assist feature to the design layout, wherein the assist feature has a first length and a first width, the assist feature connects the first main feature and the second main feature by the first length and the first width is sub-resolution in a photolithography process.

In another exemplary aspect, the present disclosure is directed to an integrated circuit (IC) photo mask. The IC photo mask includes a first main feature of the IC, a second main feature of the IC and an assist feature connecting the first and the second main features, wherein the assist feature is a sub-resolution correction feature for correcting for optical proximity effect.

In another exemplary aspect, the present disclosure is directed to an integrated circuit (IC) photo mask. The IC photo mask includes a first feature and a second feature of the IC, wherein the first and the second features are spaced a distance from each other, the distance satisfies mask creation rules and the distance is sub-resolution for photolithography patterning.

What is claimed is:

1. A method comprising:
   receiving a design layout of an integrated circuit (IC), the design layout having a first main feature; and
   adding a negative assist feature to the design layout, wherein:
   the negative assist feature has a width,
   the negative assist feature divides the first main feature into a second main feature and a third main feature by the width, and
   the width is sub-resolution in a photolithography process;
   performing an optical proximity correction (OPC) process to the second main feature and the third main feature to optimize the design layout; and
   performing a mask rule checking (MRC) process to the optimized design layout.

2. The method of claim 1, wherein the second and the third main features meet a plurality of mask creation rules.

3. The method of claim 1, wherein the first main feature is in a shape of a concave polygon.

4. The method of claim 1, wherein the photolithography process uses one of: an ultraviolet (UV) lithography process, an extreme ultraviolet (EUV) lithography process, an electron beam lithography process, an X-ray lithography process and an ion beam lithography process.

5. The method of claim 1, further comprising:
   forming a mask using the IC design layout with the negative assist feature; and
   forming a pattern on a wafer using the mask and the photolithography process.

6. The method of claim 1, further comprising:
   performing a lithography process checking (LPC) to the second and third main features to generate a plurality of contours; and
   adjusting the negative assist feature and repeating the performing the OPC process and the performing the MRC process if the plurality of contours do not meet a target boundary.

7. The method of claim 6, wherein the target boundary is defined by an outer boundary of the first main feature.

8. The method of claim 6, wherein the adjusting the negative assist feature includes one of:
   changing location of the negative assist feature in the design layout while the negative assist feature still divides the first main feature;
   increasing the width; and
   decreasing the width.

9. The method of claim 1, wherein performing the MRC process includes checking at least one dimension of the second main feature, at least one dimension of the third main feature, and at least one dimension of the negative assist feature.

10. A method, comprising:
    receiving a circuit design layout having a printing feature;
    identifying a negative optical proximity correction (OPC) feature corresponding to a portion of the printing feature to remove, wherein the negative OPC feature has a width that corresponds to a sub-resolution width;
    determining that the negative OPC feature complies with a mask rule check;
    based on determining that the negative OPC feature complies with the mask rule check, updating the circuit design layout to apply the negative OPC feature to the printing feature; and
    after updating the circuit design layout to apply the negative OPC feature, determining that the applying of the negative OPC feature to the printing feature produces a resulting feature that complies with the mask rule check.

11. The method of claim 10, wherein the applying of the negative OPC feature separates the printing feature into a first sub-feature and a second sub-feature, the method further comprising: determining that the first sub-feature and the second sub-feature comply with the mask rule check.

12. The method of claim 10 further comprising performing an OPC correction after the updating of the circuit design layout to apply the negative OPC feature and before the determining that the result of the applying of the negative OPC complies with the mask rule check.

13. The method of claim 12, wherein the OPC correction results in a further modification to the printing feature.

14. The method of claim 10 further comprising fabricating a lithographic photomask based on the updated circuit design layout.

15. The method of claim 10, further comprising:
   performing a lithography process check on the updated circuit design layout; and
   adjusting at least one of: a location or the width of the negative OPC feature based on the lithography process check.

16. A method comprising:
   receiving a circuit layout for a photolithographic mask, wherein the circuit layout includes a feature;
   identifying a portion of the feature to remove;
   determining that the portion complies with a mask rule check;
   removing the portion of the feature from the circuit layout based on determining that the portion complies with the mask rule check;
   performing the mask rule check on a result of removing the portion of the feature;
   performing a lithography process check on the result of removing the portion of the feature; and
   adjusting at least one of: a location or a size of the removed portion based on the lithography process check.

17. The method of claim 16, further comprising performing an optical proximity check process on the circuit layout after removing the portion of the feature.

18. The method of claim 17, wherein the performing of the optical proximity check results in a further modification to the feature.

19. The method of claim 16, wherein the portion has a width that is a sub-resolution width.

20. The method of claim 16, wherein the removing of the portion of the feature from the circuit layout defines a first sub-feature and a second sub-feature, wherein the first sub-feature is separate from the second sub-feature, and wherein the first sub-feature includes a protruding portion extending towards the second sub-feature.

\* \* \* \* \*